(12) United States Patent
Gogoi et al.

(10) Patent No.: US 7,448,277 B2
(45) Date of Patent: Nov. 11, 2008

(54) CAPACITIVE PRESSURE SENSOR AND METHOD THEREFOR

(75) Inventors: Bishnu Prasanna Gogoi, Scottsdale, AZ (US); Navid Yazdi, Ann Arbor, MI (US)

(73) Assignee: Evigia Systems, Inc., Ann Arbor, MI (US)

( * ) Notice: Subject to any disclaimer, the term of this patent is extended or adjusted under 35 U.S.C. 154(b) by 0 days.

(21) Appl. No.: 11/848,319

(22) Filed: Aug. 31, 2007

(65) Prior Publication Data

US 2008/0053236 A1 Mar. 6, 2008

Related U.S. Application Data

(60) Provisional application No. 60/841,428, filed on Aug. 31, 2006.

(51) Int. Cl.
*G01L 9/12* (2006.01)
*H01G 9/00* (2006.01)

(52) U.S. Cl. .................. 73/718; 73/724; 29/25.03
(58) Field of Classification Search ............ 73/718, 73/724; 29/25.03
See application file for complete search history.

(56) References Cited

U.S. PATENT DOCUMENTS 6,145,384 A * 11/2000 Ikeda et al. ............ 73/780
6,441,451 B1 * 8/2002 Ikeda et al. ............ 257/418
6,465,271 B1 * 10/2002 Ko et al. ............... 438/48
6,756,248 B2 * 6/2004 Ikeda et al. ............ 438/53
2001/0042404 A1 * 11/2001 Yazdi et al. .......... 73/504.12
2007/0216423 A1 * 9/2007 Grosjean et al. ........ 324/661

* cited by examiner

*Primary Examiner*—Andre J Allen
(74) *Attorney, Agent, or Firm*—Hartman & Hartman, P.C.; Gary M. Hartman; Domenica N. S. Hartman

(57) ABSTRACT

A capacitive pressure sensor and method for its fabrication. The sensor is fabricated from first and second wafers to have a mechanical capacitor comprising a fixed electrode and a moving electrode defined by a conductive plate. The sensor further has a diaphragm on a surface of the first wafer that is mechanically coupled but electrically insulated from the conductive plate. A conductive layer on the surface of the first wafer is spaced apart from the conductive plate to define the fixed electrode. The second wafer is bonded to the first wafer and carries interface circuitry for the sensor, including the conductive plate and the fixed electrode which are between the first and second wafers and electrically connected to the interface circuitry. At least an opening is present in the first wafer and its first conductive layer by which the diaphragm is released and exposed to an environment surrounding the sensor.

20 Claims, 4 Drawing Sheets

CAPACITIVE PRESSURE SENSOR AND METHOD THEREFOR

CROSS REFERENCE TO RELATED APPLICATIONS

This application claims the benefit of U.S. Provisional Application No. 60/841,428, filed Aug. 31, 2006, the contents of which are incorporated herein by reference.

BACKGROUND OF THE INVENTION

The present invention generally relates to MEMS (micro-electro-mechanical system) devices. More particularly, the invention relates to a capacitive pressure sensor capable of exhibiting high sensitivity in a small die size, due in part to a pressure-sensing diaphragm mechanically coupled but electrically insulated from a mechanical capacitor that generates the electrical output of the sensor.

As well known in the art, capacitive pressure sensors employ a diaphragm that deflects in response to pressure, so that an electrode carried or defined by the diaphragm moves relative to a fixed (stationary) electrode with which the diaphragm defines a mechanical capacitor. Capacitive pressure sensors can be configured for measuring absolute, differential, and gage pressures, and have the advantage of low power consumption requirements and reduced susceptibility to temperature effects for sensitivity and offset. However, capacitive pressure sensors are susceptible to parasitic capacitances and therefore need to be integrated with interface circuitry. In addition, their dynamic range is limited unless closed-loop operation is utilized and high pressure resolution can be achieved with the sensor structure. High sensitivity in pressure sensors is typically achieved by increasing the diaphragm size, reducing the diaphragm thickness, or some other measure whose effect is to maximize the deflection for a given input pressure. However, increased sensor size is often undesirable or not practical and increased deflection is associated with nonlinearity in the output that requires additional compensation circuitry, with the further disadvantage of consuming more power. Increased size and reduced thickness also render the diaphragm more susceptible to breakage.

Capacitive pressure sensors are also sensitive to their operating environments, including fluidic, chemical, and electromagnetic effects. In some cases the diaphragm, which is typically formed from one or more conductive layers, must be protected from its operating environment while at the same time being capable of deflection in response to changes in pressure within the environment. To promote their media compatibility, diaphragms can be protected with, for example, an elastomeric layer or a incompressible fluid such as an oil that transmits environmental pressure to the diaphragm. Protection of the sensor and interface circuit from electromagnetic effects is generally accomplished at the package or module level by providing an electromagnetic interference (EMI) shielding layer, which can be complex and expensive to implement. The integration of a pressure sensor with CMOS interface circuitry can also be challenging because of restrictions imposed by the CMOS fabrication process due to thermal budget and topography.

In view of the foregoing, a need exists for capacitive pressure sensors that are capable of being integrated with a CMOS interface circuitry and exhibiting high sensitivity and a wide dynamic range within a small die size, while also being immune to adverse media and electromagnetic effects.

BRIEF SUMMARY OF THE INVENTION

The present invention provides a method of fabricating a MEMS capacitive pressure sensor, and the resulting pressure sensor. The sensor has a pressure-sensing diaphragm that is mechanical coupled but electrical isolated from a mechanical capacitor that generates the output of the sensor. Because the diaphragm is electrically decoupled from the capacitor, the diaphragm can be fabricated so that its performance is essentially immune to adverse media and EMI effects. The diaphragm and mechanical capacitor are fabricated in a first wafer that is preferably hermetically bonded to a second (e.g., CMOS) wafer carrying interface circuitry to yield an integrated, high-sensitivity, hermetically-sealed capacitive pressure sensor in a small die size.

According to a first aspect of the invention, a method of fabricating a capacitive pressure sensor includes forming the diaphragm on a surface of the first wafer containing at least a first conductive layer, forming a conductive plate on the first wafer so as to be mechanically coupled but electrically insulated from the diaphragm, depositing a sacrificial layer over the conductive plate, depositing a conductive layer on the sacrificial layer to define a fixed electrode spaced apart from the conductive plate, and then removing the sacrificial layer to yield a sensor structure on the first wafer that comprises the diaphragm and a mechanical capacitor formed by the conductive plate and the fixed electrode. The first wafer is then bonded to a second wafer that carries interface circuitry for the sensor. with the result that the sensor structure faces the second wafer and the mechanical capacitor thereof is electrically connected to the interface circuitry. At least a portion of the first wafer is then etched to release the diaphragm and expose the diaphragm, but not the mechanical capacitor, to an environment in which pressure changes therein cause the diaphragm to deflect and, as a result of the mechanical coupling between the diaphragm and the conductive plate, cause the conductive plate to move relative to the fixed electrode.

According to a second aspect of the invention, a capacitive pressure sensor includes a first wafer containing a first conductive layer, a diaphragm on a surface of the first wafer and overlying the first conductive layer, a conductive plate on the first wafer and mechanically coupled but electrically insulated from the diaphragm, and a conductive layer on the surface of the first wafer and spaced apart from the conductive plate to define a fixed electrode, yielding a sensor structure on the first wafer that comprises the diaphragm and a mechanical capacitor formed by the conductive plate and the fixed electrode. The first wafer is bonded to a second wafer that carries interface circuitry for the sensor, such that the sensor structure faces the second wafer and the mechanical capacitor thereof is electrically connected to the interface circuitry. At least an opening in the first wafer releases the diaphragm and exposes the diaphragm, but not the mechanical capacitor, to an environment in which pressure changes therein cause the diaphragm to deflect and, as a result of the mechanical coupling between the diaphragm and the conductive plate, cause the conductive plate to move relative to the fixed electrode.

A capacitive pressure sensor fabricated in accordance with this invention is preferably capable of very high pressure sensitivity in a compact space as a result of the diaphragm responsive to pressure being electrically decoupled from the mechanical capacitor that generates the electrical output of the sensor. According to preferred aspects of the invention, the sensitivity of the sensor is promoted by fabricating the diaphragm to be small and thin, such as by surface micromachining, and the conductive plate that defines the moving electrode of the capacitor is larger than the diaphragm to which it is mechanically coupled. As a result, small deflections of the diaphragm can be converted to a large change in capacitance while maintaining linearity because of the larger size of the plate, and increasing the size of the flat plate can achieve increased output sensitivity independently of diaphragm size. Consequently, the size of the sensor can be significantly reduced while maintaining high pressure sensitivity.

Additional advantages of this invention include the ability to address the challenges of media compatibility and robustness to electromagnetic interference by electrically decoupling the mechanically-sensitive element of the sensor (the diaphragm) from the electrically-sensitive element of the sensor (the sensing capacitor). By providing mechanical coupling between the electrically-sensitive element and the pressure-sensitive element, and sealing both within a hermetically-sealed cavity, the electrically-sensitive element of the capacitive sensor is protected from adverse media effects in the operating environment. By providing electrical isolation between the electrically-sensitive element and the pressure-sensitive element, the diaphragm can be fabricated to include a conductive layer maintained at a fixed potential to yield a Faraday cage capable of shielding the capacitive sensor from EMI effects. In a preferred embodiment, the first wafer is an SOI (silicon-on-insulator)wafer, and an electrically-conductive handle layer of the SOI wafer can also be employed as a second external Faraday cage by maintaining the handle layer at a fixed potential.

According to other preferred aspects of the invention, the sensor is fabricated on the first wafer using surface micromachining technology, and typical restrictions relating to CMOS integration are addressed by utilizing vertical interconnects to connect the first wafer with a CMOS wafer after the surface micromachining processes have been largely completed. A bond ring can be used to bond the wafers together and form a hermetically sealed cavity that encloses the sensor structures (including the diaphragm and mechanical capacitor), and preferably also protects the vertical interconnects from the operating environment of the sensor. By this technique, process complexity is reduced and a high yield manufacturing process can be obtained utilizing batch fabrication.

Other objects and advantages of this invention will be better appreciated from the following detailed description.

DETAILED DESCRIPTION OF THE INVENTION

Figure 1:
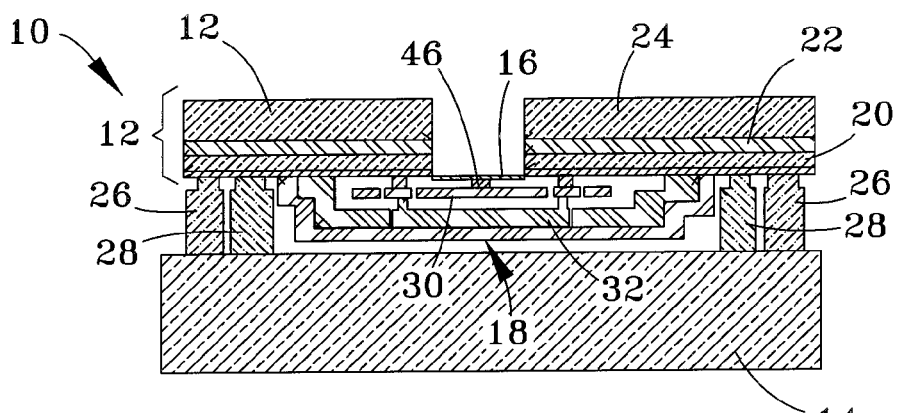
FIG. 1 is a cross-sectional representation of a capacitive pressure sensor fabricated from an SOI wafer integrated with a CMOS wafer in accordance with an embodiment of this invention.
Figure 2A:
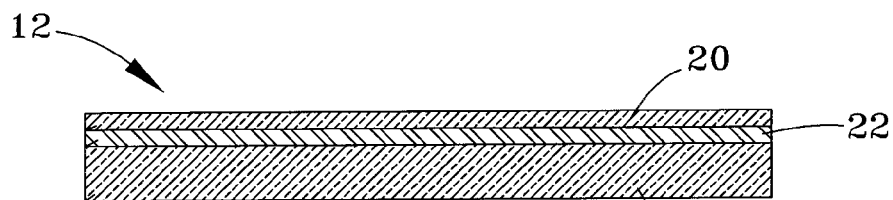
FIGS. 2a through 2n represent steps in the fabrication process of the sensor of FIG. 1.
Figure 2B:
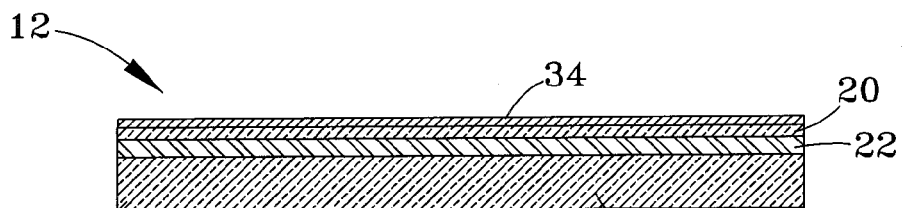
Figure 2C:
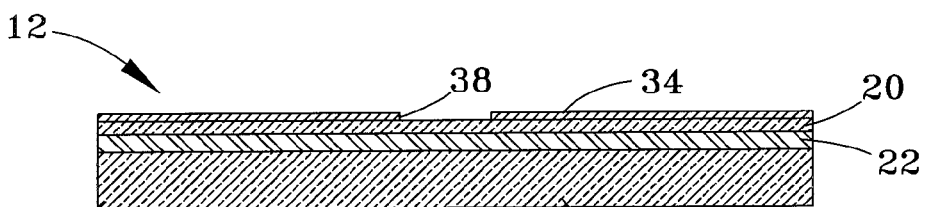
Figure 2D:
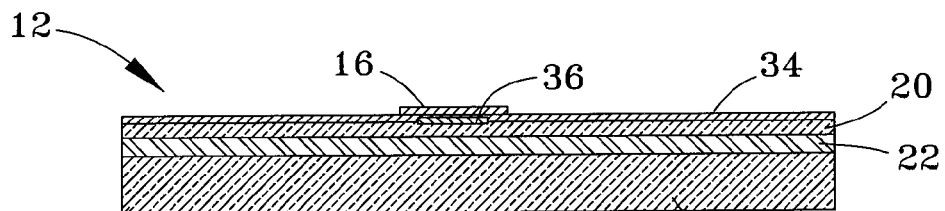
Figure 2E:
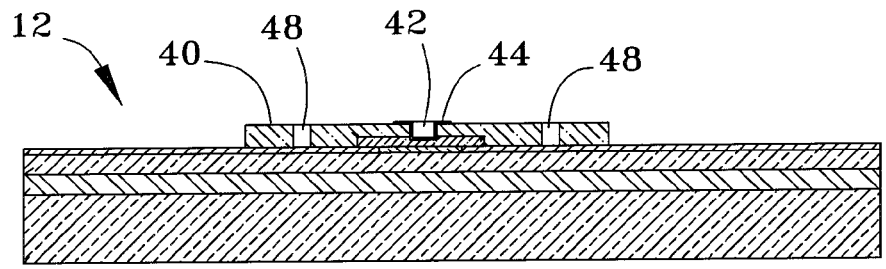
Figure 2F:
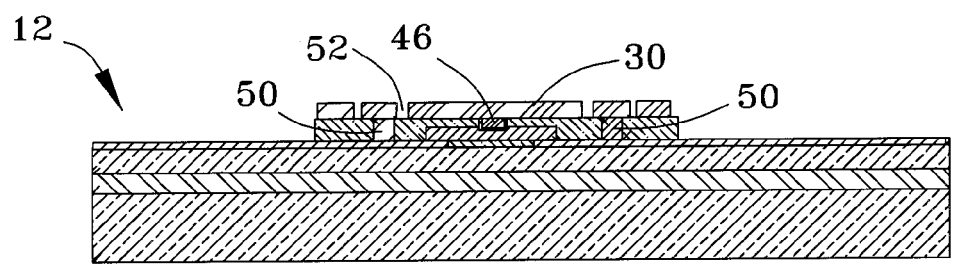
Figure 2G:
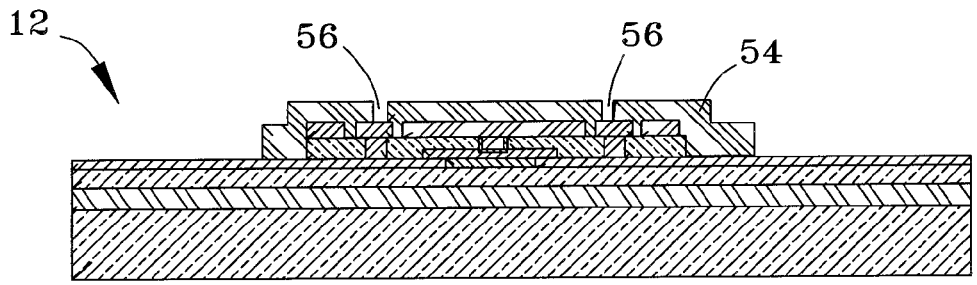
Figure 2H:
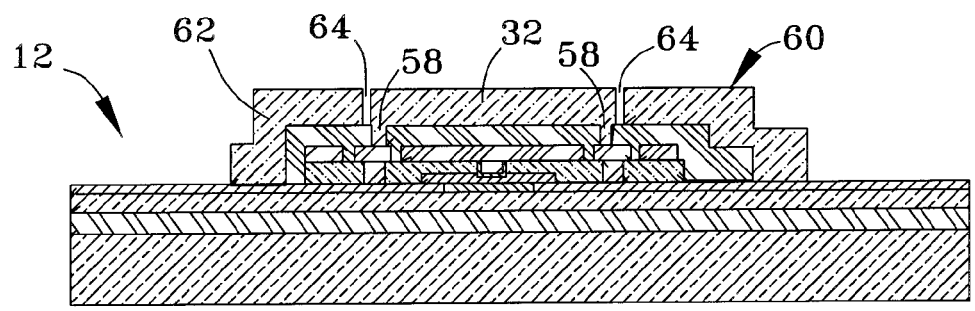
Figure 2I:
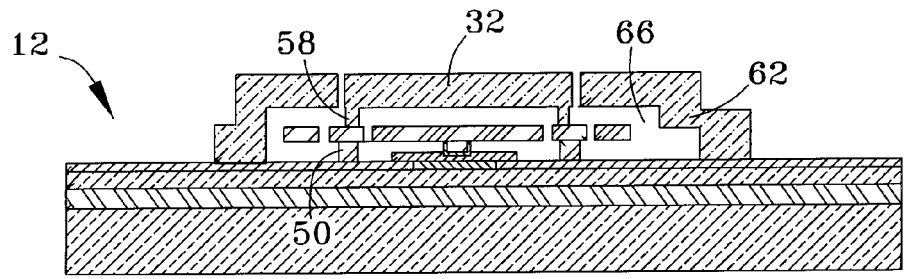
Figure 2J:
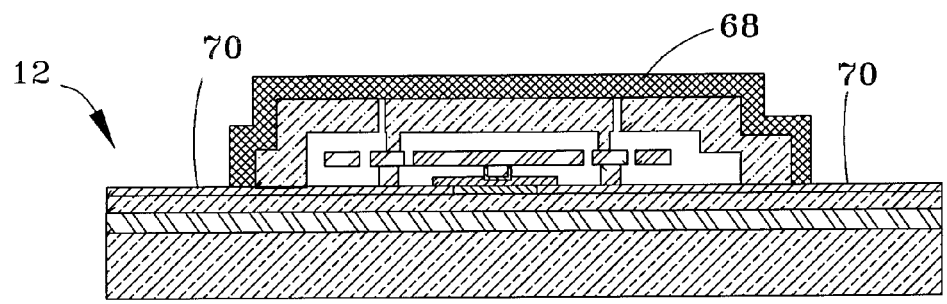
Figure 2K:
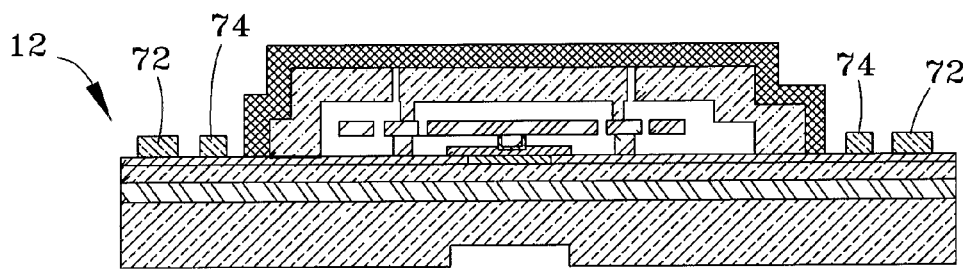
Figure 2L:
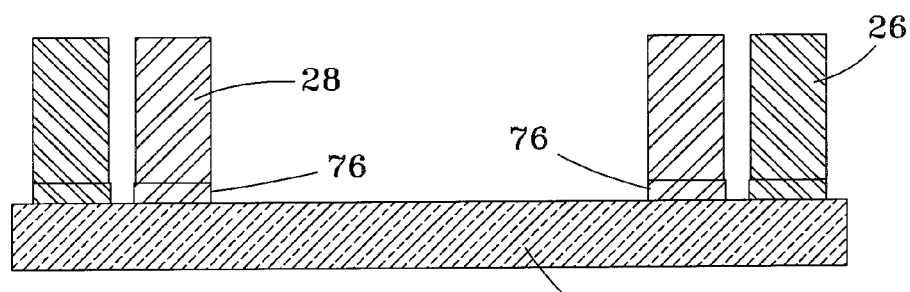
Figure 2M:
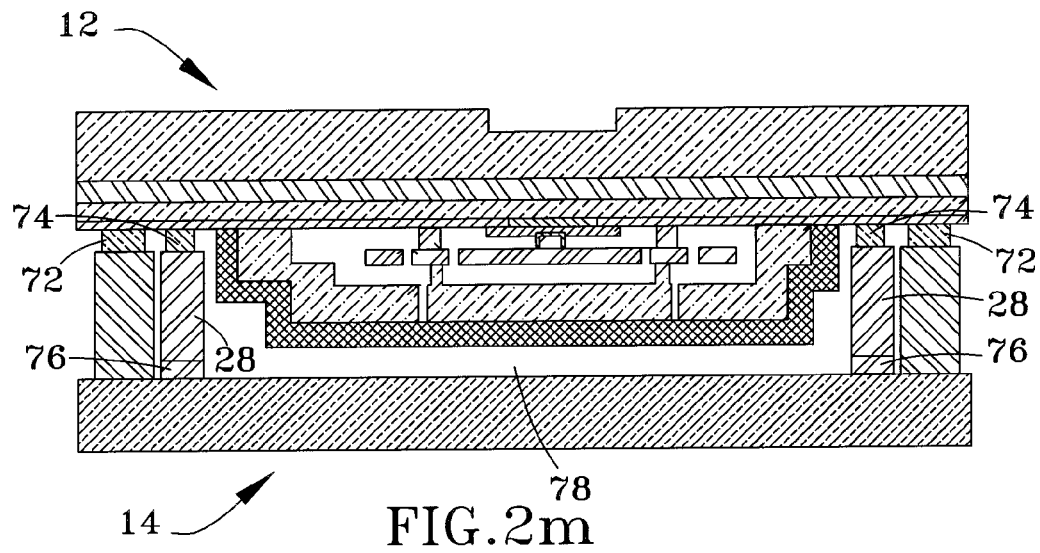
Figure 2N:
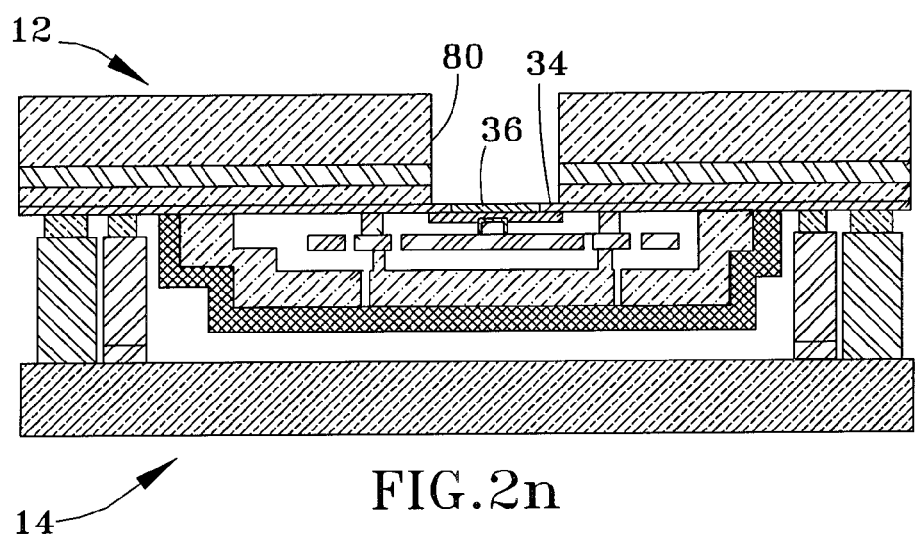

Illustrated in FIG. 1 is a capacitive pressure sensor 10 within the scope of the present invention, while FIGS. 2a through 2n represent suitable steps for its fabrication. The drawings are drawn for purposes of clarity when viewed in combination with the following description, and therefore are not necessarily to scale. It should also be noted that terms such as "upper," "lower," "topside," and "backside" are in reference to the sensor 10 as shown in the Figures, and are not limitations to the sensor 10 or its use.

In FIG. 1, an SOI wafer 12 carrying a pressure-sensing diaphragm 16 and a mechanical capacitor 18 are shown bonded to a second wafer 14 carrying interface circuitry (not shown) for the capacitor 18. According to a preferred implementation of the invention, the wafer 14 is a CMOS wafer, and will be referred to as such in the following discussion. As is conventional, the SOI wafer 12 is shown as including an electrically-conductive (e.g., doped silicon) device layer 20 separated from an electrically-conductive (e.g., doped silicon) handle layer 24 by an electrically-insulative buried oxide (BOX) layer 22. The SOI wafer 12 is preferably hermetically bonded to the CMOS wafer 14 with a bond ring 26 that surrounds vertical interconnects 28 through which the mechanical capacitor 18 is electrically connected to the interface circuitry on the CMOS wafer 14.

As evident from FIG. 1, a plate 30 is attached to the underside of the diaphragm 16. The plate 30 is formed of an electrically-conductive material and serves as the moving electrode to a fixed electrode 32 attached to the SOI wafer 12 and spaced apart from the plate 30. When appropriately charged, the plate 30 and fixed electrode 32 define the mechanical capacitor 18, which according to a preferred aspect of the invention is mechanically coupled yet electrically decoupled from the pressure-sensing diaphragm 16. Also according to a preferred aspect of the invention, the conductive plate (moving electrode) 30 of the capacitor 18 can be thicker and/or have lateral dimensions that are significantly larger than that of the diaphragm 16 to which it is mechanically coupled. As a result, small deflections of the diaphragm 16 can be converted to a relatively large change in capacitance output generated by the mechanical capacitor 18, and increasing the size of the plate 30 can achieve increased output sensitivity and linearity independently of diaphragm size. Consequently, the size of the sensor 10 can be significantly reduced while maintaining high pressure sensitivity.

The fabrication process represented in FIGS. 2a through 2n uses a combination of surface and bulk micromachining processes that are compatible with post-CMOS fabrication to enable CMOS integration. All fabrication steps are preferably compatible with batch processing and can be performed at wafer level, providing the cost advantage of a high-yield process that can be performed in a standard MEMS manufacturing facility. As will also be apparent from the following description, while certain materials, unit process steps, and fabrication sequences are set forth by example, those skilled in the art will be aware that other materials, unit process steps, and fabrication sequences could be used to form the SOI/CMOS capacitive pressure sensor 10.

FIG. 2a represents an initial phase of the fabrication process, in which the SOI wafer 12 exists with its device layer 20, BOX layer 22, and handle layer 24. Preferred thicknesses for the device layer 20 and handle layer 24 are about 30 to about 50 micrometers and about 150 to about 300 micrometers, respectively, though lesser and greater thicknesses are foreseeable and also within the scope of the invention. The thickness of the BOX layer 22 need only be sufficient to provide electrical insulation between the device and handle layers 20 and 24. In FIG. 2b, a dielectric (e.g., oxide) layer 34 has been deposited or otherwise formed on the device layer 20, and FIG. 2c shows the result of patterning and etching the dielectric layer 34 to define an opening 38 that exposes the underlying device layer 20. FIG. 2d shows a thin dielectric (e.g., oxide) layer 36 that has been deposited in the opening 38, over which a layer has been deposited and patterned to define the diaphragm 16. The diaphragm 16 can be formed of a dielectric material, though in one embodiment the diaphragm 16 is formed to contain at least one conductive layer, for example, doped polysilicon preferably deposited by low pressure chemical vapor deposition (LPCVD). A suitable thickness for the diaphragm 16 is about 1.1 micrometers, through lesser and greater thicknesses are foreseeable and within the scope of the invention. The diaphragm 16 is also shown following patterning and etching to define its perimeter. Suitable lateral dimensions (e.g., width/diameter) for the diaphragm 16 are in a range of tens to hundreds of micrometers, through lesser and greater dimensions are also foreseeable and within the scope of the invention. Generally, minimizing the thickness of the diaphragm 16 has the effect of promoting its sensitivity to pressure, while minimizing the size (lateral dimensions) of the diaphragm 16 has the effect of promoting the linearity of its response to pressure. During the etching and deposition steps of FIGS. 2c and 2d, electrical contacts (not shown) for the vertical interconnects 28 can also be defined in the dielectric layer 34 surrounding the diaphragm 16.

FIG. 2e represents the result of depositing a sacrificial layer 40, such as an LPCVD oxide having a thickness of about 2 micrometers. The sacrificial layer 40 will subsequently define the spacing of the capacitor moving plate 30 from the diaphragm 16, and those skilled in the art will appreciate that the thickness of the sacrificial layer 40 can be optimized to enhance the performance of the sensor 10. Those skilled in the art will also appreciate that the thickness of the sacrificial layer 40 can be optimized to enhance the EMI performance of the sensor 10, as discussed in reference to FIG. 2n. FIG. 2e also shows the result of etching an opening 42 in the sacrificial layer 40, preferably over the center of the diaphragm 16. The opening 42 is used in this process to define a rigid mechanical contact 46 between the capacitor moving plate 30 and the diaphragm 16, and for this reason a suitable width for the opening 42 is about six micrometers, though lesser and greater widths are also foreseeable. Generally, the contact 46 should be sufficiently small (e.g., smaller lateral dimensions than the diaphragm 16) to minimize any detrimental influence on the desired deflection characteristics of the diaphragm 16, while being of sufficient size to provide reliable mechanical coupling to the plate 30. An electrically insulating layer 44 (e.g., LPCVD silicon nitride) is preferably deposited within the opening 42 and on the surface of the sacrificial layer 40 immediately surrounding the opening 42 to ensure that the diaphragm 16 and plate 30 will be electrically isolated from each other yet mechanically coupled to each other. Openings 48 for anchor pillars 50 (FIG. 2f) for the plate 30 are also shown as having been defined in FIG. 2e. In the completed sensor 10, the anchor structures 50 serve to enhance the mechanical stiffness of the plate 30, and are therefore preferably placed in regular intervals inside the perimeter of the plate 30.

In FIG. 2f, the openings 42 and 48 have been filled and the material for the plate 30 has been deposited and patterned. A suitable material for the plate 30, mechanical contact 46, and anchor structures 50 is LPCVD doped polysilicon. A suitable thickness for the plate 30 is about 2 micrometers, though lesser and greater thicknesses are also within the scope of the invention. As previously noted and as evident from FIG. 2f, the conductive plate 30 that defines the moving electrode of the capacitor 18 can be advantageously formed to be both thicker and have lateral dimensions that are significantly larger than that of the diaphragm 16 to which it is mechanically coupled, such that the sensitivity of the diaphragm 16 can be altered and even optimized independent of the plate 30 while simultaneously promoting the linearity of the output of the sensor 10. FIG. 2f shows the plate 30 as containing openings 52 through which etching of the sacrificial layer 40 can be conducted in a later step (FIG. 2i).

In FIG. 2g, a second sacrificial layer 54 has been deposited that will define the spacing between the moving plate 30 and fixed electrode 32 of the capacitor 18. A suitable material for the sacrificial layer 54 is LPCVD oxide. FIG. 2g further shows the result of patterning and etching the sacrificial layer 54, as well as defining openings 56 in the sacrificial layer 54 at locations where a second set of support pillars 58 (FIG. 2h) will be subsequently formed. The fixed electrode 32 of the sensor 10 is then formed by depositing, patterning, and etching an electrically conductive layer 60 over the sacrificial layer 54, as shown in FIG. 2h. A suitable material for the fixed electrode 32 is doped polysilicon, with a suitable thickness being about three micrometers, though lesser and greater thicknesses are also within the scope of the invention. In addition to the fixed electrode 32, the conductive layer 60 also defines a cap structure 62 that encloses the moving plate 30 and diaphragm 16 on the SOI wafer 12, as well as the support pillars 58 that, in combination with the pillars 50, maintain a fixed spacing between the fixed electrode 32 and the surface of the SOI wafer 12. Etch holes 64 are also defined in the conductive layer 60 during this step.

FIG. 2i shows the sacrificial layers 40 and 54 as having been removed between the cap structure 62 and the surface of the SOI wafer 12, yielding a cavity 66 that contains the diaphragm 16 and the moving plate 30, the latter supported between the opposing sets of pillars 50 and 58. Etching can be conducted through the etch holes 64 with a HF etchant, followed by a thorough rinse and drying. As shown in FIG. 2j, the cavity 66 is then sealed, such as by depositing an oxide layer 68 using a line-of-sight process, for example, plasma-enhanced chemical vapor deposition (PECVD). Deposition of the oxide layer 68 is preferably performed in a vacuum, for example, about 10 torr or less, to promote the sensitivity and resolution of the mechanical capacitor 18. To ensure the mechanical stiffness of the cap structure 62, the oxide layer 68 can be patterned to define openings 70 only where required for electrical contact between the SOI and CMOS wafers 12 and 14.

In FIG. 2k, the handle layer 24 of the SOI wafer has been patterned using front-to-backside alignment and the mask etched. FIG. 2k also shows the result of electroplating using a photo-resist mold to form metal stacks 72 and 74 (e.g., Ni/Au, tin, copper, their alloys, etc.) for the bonding ring 26 and vertical interconnects 28, respectively.

FIG. 2l shows the CMOS wafer 14 as having undergone processing steps that entail depositing and patterning a metal stack (e.g., Ni/Au) to form bonding pads 76 that contact pads (not shown) of the CMOS circuitry on the wafer 14, followed by deposition of the metal for the bonding ring 26 and vertical interconnects 28. Suitable materials for the ring 26 and interconnects 28 include Ni/Au, tin, copper, Sn—Cu alloys, etc. In FIG. 2m, the SOI wafer 12 has been flipped and aligned to register its metal stacks 72 and 74 with the bonding ring 26 and vertical interconnects 28 on the wafer 14. While applying light pressure, the two wafers 12 and 14 are then bonded at a temperature sufficient to bond the metals of the metal stacks 72 and 74 and their respective bonding ring 26 and interconnects, but at a temperature below that which might damage the CMOS interface circuitry on the wafer 14, for example, less than about 400° C. The bonding step is preferably conducted in a vacuum, e.g., preferably 100 mtorr or less, so that the bonding ring 26 forms a second hermetically-sealed cavity 78 that contains the diaphragm 16, moving plate 30, and fixed electrode 32.

FIG. 2*n* shows the result of etching an opening 80 in the backside of the SOI wafer 12. This etch is facilitated by a partial etch of the handle layer 24 shown in FIG. 2*m*. The partial etch is done to transfer the etch hole pattern and backside alignment marks for the consequent processing steps to the backside of the SOI wafer 12 by alignment of bottom to top surface (using double-side aligners conventionally used in MEMS fabrication). Those skilled in the art will appreciate that other techniques for transferring the pattern to the backside of the SOI wafer 12 can be used, and such alternatives are within the scope of the invention. Etching of the backside opening 80 progresses by first etching an opening in the handle layer 24 to expose the BOX layer 22 beneath, followed by etching of the exposed BOX layer 22 to expose the underlying device layer 20, which in turn is etched to expose the oxide layer 36 that was deposited in FIG. 2*d*. Suitable processes for etching the device and handle layers 20 and 24 include deep reactive ion etching (DRIE), while the BOX layer 22 can be etched by a wet etch, a dry etch, or a combination of the two. The oxide layer 36 serves as an etch stop during etching of the device layer 20. Finally, removal of the oxide layer 36 and adjacent portions of the dielectric layer 34 by a suitable etch process yields the sensor 10 as shown in FIG. 1. At this point in the fabrication process, the diaphragm 16, but not the mechanical capacitor 18, is exposed to the surrounding environment through the backside opening 80 in the SOI wafer 12, and therefore deflects in response to pressure changes in the environment. As a result of the mechanical coupling between the diaphragm 16 and plate 30, movement of the diaphragm 16 in response to pressure changes also causes the plate 30 to move relative to the fixed electrode 32, thereby resulting in a change in the capacitive output of the mechanical capacitor 18 when the plate 30 and electrode 32 are appropriately charged.

If the diaphragm 16 is formed of an electrically conductive material (such as doped polysilicon), the diaphragm 16 can be charged and held at a fixed potential to effectively create a Faraday cage over the conductive plate 30. The handle layer 24 can also be charged through a contact (not shown) extending through the device and BOX layers 20 and 22, enabling the entire handle wafer 24 to define a second Faraday cage over the capacitor 18.

Figure 3:
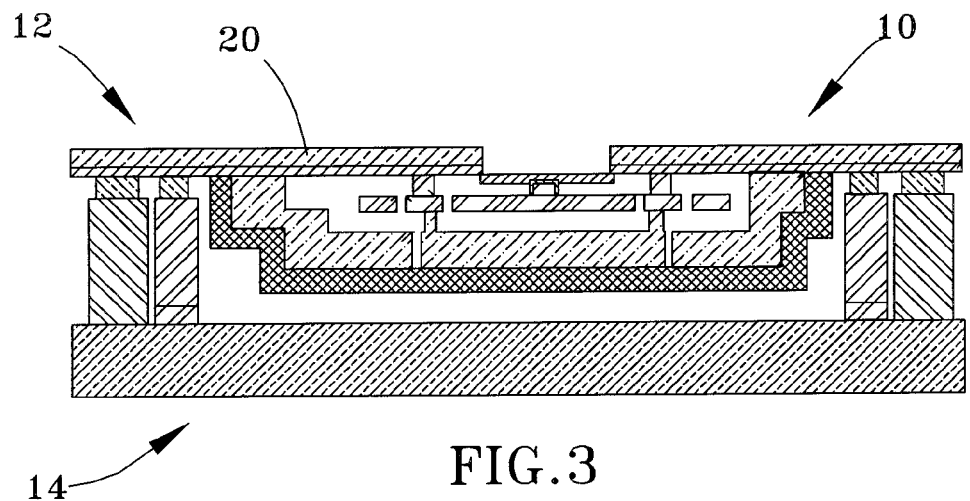
FIG. 3 represents an alternative embodiment of the capacitive pressure sensor of this invention, in which a handle layer and a buried oxide layer of the SOI wafer have been completely removed.

FIG. 3 shows an alternative embodiment in which the handle layer 24 and BOX layer 22 of the SOI wafer 12 have been completely removed. As before, removal of the handle layer 24 can be by DRIE, using the BOX layer 22 as an etch stop, followed by removal of the BOX layer 22 by a wet etch, a dry etch, or a combination of the two. The device layer 20 can then be selectively etched (e.g., DRIE) above the oxide layer 36, with the oxide layer 36 serving as an etch stop. Thereafter, the oxide layer 36 is also removed to yield the sensor 10 shown in FIG. 3, which can be significantly thinner than the sensor 10 as it is represented in FIG. 1.

While the invention has been described in terms of specific embodiments, it is apparent that other forms could be adopted by one skilled in the art. For example, the physical configuration of the sensor 10 could differ from that shown, and other processes, materials, and dimensions could be substituted for those noted. Therefore, the scope of the invention is to be limited only by the following claims.

The invention claimed is:

1. A method of forming a capacitive pressure sensor having a mechanical capacitor comprising a fixed electrode and a moving electrode defined by a conductive plate, the method comprising:

forming a diaphragm on a surface of a first wafer containing at least a first conductive layer;

forming the conductive plate on the first wafer so as to be mechanically coupled but electrically insulated from the diaphragm;

depositing a sacrificial layer over the conductive plate;

depositing a conductive layer on the sacrificial layer to define the fixed electrode spaced apart from the conductive plate;

removing the sacrificial layer to yield a sensor structure on the first wafer, the sensor structure comprising the diaphragm and the mechanical capacitor comprising the conductive plate and the fixed electrode;

bonding the first wafer to a second wafer that carries interface circuitry for the sensor, the sensor structure facing the second wafer and the mechanical capacitor thereof being electrically connected to the interface circuitry as a result of the bonding step; and then etching at least a portion of the first wafer to release the diaphragm and form an opening that exposes the diaphragm to an environment in which pressure changes therein cause the diaphragm to deflect and, as a result of the mechanical coupling between the diaphragm and the conductive plate, cause the conductive plate to move relative to the fixed electrode.

2. The method according to claim 1, wherein the diaphragm and the conductive plate are hermetically sealed within a cavity formed in part by the fixed electrode.

3. The method according to claim 1, wherein as a result of the bonding step the sensor structure is contained within a hermetically sealed cavity formed by the first wafer, the second wafer, and a bonding ring that bonds the first wafer to the second wafer.

4. The method according to claim 3, wherein the hermetically sealed cavity contains leads that electrically connect the conductive plate and the fixed electrode to the interface circuitry.

5. The method according to claim 1, wherein the step of forming the diaphragm comprises depositing a dielectric layer on the first conductive layer, etching an opening in the dielectric layer, depositing a second dielectric layer in the opening, and then forming the diaphragm on the second dielectric layer.

6. The method according to claim 1, wherein the conductive plate is formed by depositing a second sacrificial layer on the diaphragm, forming an opening in the second sacrificial layer, forming a mechanical contact in the opening, and then forming the conductive plate on the second sacrificial layer so as to be spaced apart from the diaphragm by the second sacrificial layer and the mechanical contact, wherein the mechanical contact mechanically couples but does not electrically couple the conductive plate to the diaphragm.

7. The method according to claim 6, wherein the step of removing the sacrificial layer also removes the second sacrificial layer.

8. The method according to claim 1, wherein the diaphragm is formed of an electrically-conductive material and is electrically charged to define a Faraday cage for the conductive plate.

9. The method according to claim 1, wherein the first wafer is a silicon-on-oxide (SOI) wafer comprising a second conductive layer separated from the first conductive layer by an insulative buried oxide (BOX) layer.

10. The method according to claim 9, wherein the second conductive layer is electrically charged to define a Faraday cage for the mechanical capacitor.

11. The method according to claim 9, wherein the etching steps entails entirely removing the second conductive layer.

12. The method according to claim 10, wherein the etching steps further entails entirely removing the BOX layer.

13. A capacitive pressure sensor having a mechanical capacitor comprising a fixed electrode and a moving electrode defined by a conductive plate, the sensor comprising:
- a first wafer containing a first conductive layer;
- a diaphragm on a surface of the first wafer and overlying the first conductive layer;
- the conductive plate on the first wafer and mechanically coupled but electrically insulated from the diaphragm;
- a conductive layer on the surface of the first wafer and spaced apart from the conductive plate to define the fixed electrode and a sensor structure on the first wafer that comprises the diaphragm and the mechanical capacitor;
- a second wafer bonded to the first wafer and carrying interface circuitry for the sensor, the sensor structure facing the second wafer and the mechanical capacitor thereof being electrically connected to the interface circuitry;
- at least an opening in the first wafer that releases the diaphragm and exposes the diaphragm to an environment in which pressure changes therein cause the diaphragm to deflect and, as a result of the mechanical coupling between the diaphragm and the conductive plate, cause the conductive plate to move relative to the fixed electrode.

14. The capacitive pressure sensor according to claim 13, wherein the diaphragm and the conductive plate are hermetically sealed within a cavity formed in part by the fixed electrode.

15. The capacitive pressure sensor according to claim 13, wherein the diaphragm, the conductive plate, and the fixed electrode are contained within a hermetically sealed cavity formed by the first wafer, the second wafer, and a bonding ring that bonds the first wafer to the second wafer.

16. The capacitive pressure sensor according to claim 15, wherein the hermetically sealed cavity contains leads that electrically connect the conductive plate and the fixed electrode to the interface circuitry.

17. The capacitive pressure sensor according to claim 13, further comprising a mechanical contact that spaces the conductive plate from the diaphragm and mechanically couples but does not electrically couple the conductive plate to the diaphragm.

18. The capacitive pressure sensor according to claim 13, wherein the diaphragm is formed of an electrically-conductive material and is electrically charged to define a Faraday cage for the conductive plate.

19. The capacitive pressure sensor according to claim 13, wherein the first wafer is a silicon-on-oxide (SOI) wafer comprising a second conductive layer separated from the first conductive layer by an insulative buried oxide (BOX) layer.

20. The capacitive pressure sensor according to claim 19, wherein the second conductive layer is electrically charged to define a Faraday cage for the mechanical capacitor.

* * * * *